US 6,633,699 B1

(12) United States Patent
Legay et al.

(10) Patent No.: US 6,633,699 B1
(45) Date of Patent: Oct. 14, 2003

(54) OPTOELECTRONIC SYSTEM COMPRISING SEVERAL SECTIONS HAVING RESPECTIVE FUNCTIONS COUPLED BY EVANESCENT COUPLING AND PRODUCTION PROCESS

(75) Inventors: Philippe Legay, Louannec (FR); Abderrahim Ramdane, Sceaux (FR)

(73) Assignee: France Telecom, Paris (FR)

(*) Notice: Subject to any disclaimer, the term of this patent is extended or adjusted under 35 U.S.C. 154(b) by 0 days.

(21) Appl. No.: 09/936,244

(22) PCT Filed: Mar. 7, 2000

(86) PCT No.: PCT/FR00/00558
§ 371 (c)(1),
(2), (4) Date: Jan. 23, 2002

(87) PCT Pub. No.: WO00/54379
PCT Pub. Date: Sep. 14, 2000

(30) Foreign Application Priority Data

Mar. 8, 1999 (FR) .......................................... 99 02822

(51) Int. Cl.$^7$ ................................................ G02B 6/26
(52) U.S. Cl. .............................. 385/30; 385/14; 372/50
(58) Field of Search ........................... 385/14, 30, 37, 385/130, 131, 132; 372/50, 96, 102, 20, 45, 26, 46

(56) References Cited

U.S. PATENT DOCUMENTS 4,054,363 A * 10/1977 Suematsu ................... 385/14

FOREIGN PATENT DOCUMENTS

EP 0 741 316 A * 11/1996
EP 0 828 325 A * 3/1998

OTHER PUBLICATIONS

Lee et al. "Integration of Semiconductor Laser Amplifiers with Sampled Grating Tunable Lasers for WDM Applications" IEEE Journal of Selected Topics in Quantum Electronics, US, IEEE Servic Center, vol. 3, No. 2, pp. 615–627.*

Chuang et al. "Photonic Integrated Tunable Receivers with Optical Preamplifiers for Direct Detection" Applied Physics Letters, US, American Institute of Physics. New York, vol. 63, No. 7, pp. 880–882.*

Koch et al. "High Performance Tunable 1.5 M InGaAs/InGaAsP Multiple Quantum Well Distributed Bragg Reflector Lasers" Applied Physics Letters, US, American Institute of Physics. New York, vol. 53, No. 12, pp. 1036–1038.*

* cited by examiner

*Primary Examiner*—Phan T. H. Palmer
(74) *Attorney, Agent, or Firm*—Blakely, Sokoloff, Taylor & Zafman

(57) ABSTRACT

An optoelectronic system comprising at least three sections corresponding to specific respective functions and having different respective band gap energies, at least for the adjacent pairs of sections. These three sections consist of at least two layers superposed by epitaxy. The upper layer is etched in order to define said sections in the form of two separate end sections defined in the upper layer on each side of an intermediate section defined in the lower layer, and to allow coupling between the intermediate section and each of the end sections which flank it, by evanescent coupling. The length of the intermediate section is such that the product K×L, in which K represents the coupling coefficient of a grating of the intermediate section, is one of the order of 1.

19 Claims, 3 Drawing Sheets end-to-end coupling

Selective epitaxy

Evanescent coupling

"Single structure"

OPTOELECTRONIC SYSTEM COMPRISING SEVERAL SECTIONS HAVING RESPECTIVE FUNCTIONS COUPLED BY EVANESCENT COUPLING AND PRODUCTION PROCESS

BACKGROUND OF THE INVENTION

1. Field of the Invention

The present invention relates to the field of optoelectronics.

In particular, the aim of the invention is the production of integrated laser-guide-modulator sources.

BRIEF SUMMARY OF THE INVENTION

There may be many applications of the present invention, such as:

high-rate optical transmission of the NRZ (tunable laser-modulator) type or RZ (OTDM system) type;

distribution;

radio-on-fiber (production of BLU circuit).

Many methods have already been explored in order to achieve active-passive coupling (for example for laser-modulator integration) on the same substrate.

Mention may especially be made of four methods described in the literature: 1) end-to-end coupling, 2) organometallic-selective epitaxy, 3) evanescent coupling and 4) "single structure".

End-to-end coupling consists in firstly growing epitaxially a laser structure, in etching this first structure at the locations dedicated to a modulator and then in carrying out, at these locations, the epitaxy of the structure of the modulator. This technique involves at least three epitaxy steps [1]. An example of a structure obtained with this method is illustrated in FIG. 1, in which the wavelengths $\lambda 1, \lambda 2, \lambda 3$ symbolically indicate the various transition energies of each section.

Organometallic-selective epitaxy requires only a single epitaxy step. Its principle is based on the possibility of being able to modify locally, by the presence of a dielectric mask of well-defined geometry, the thickness and the composition of the material, and consequently the wavelength corresponding to the band gap width of the active region of the epitaxially grown structure (for example to that of the structure on an unmasked region) [2]. It is thus possible to obtain, side by side, several regions having different band gaps corresponding to as many optical functions. For DBR laser-modulator integration for example (DBR standing for Distributed Bragg Reflector, that is to say a laser with a distributed Bragg grating), these three gaps correspond to the active section of the laser, to a Bragg region and to a modulator. FIG. 2 illustrates a cross-sectional schematic view of growth by this method of selective epitaxy. In this FIG. 2, the transition energy of each section is represented by its equivalent wavelength.

Evanescent (or vertical) coupling allows the formation of two guiding structures placed one on top of the other in a single epitaxy step. An etching operation makes it possible to reveal the regions where the upper layer is not desired, thus revealing the modulator or guide section. The optical mode remains confined within the upper layer of higher refractive index and then, from the laser-modulator interface, is propagated into the lower layer [3], [4]. FIG. 3 shows the basic principle of the method of evanescent coupling. The optical mode passes from one layer to another via the set of index and geometry differences of the guides used.

The method known as the "single structure" method consists in using the same multiple quantum well stack for each of the sections of the component (3 in the case of DBR laser-modulator integration)[5],[6]. This method relies on the optical gain spectrum broadening effects for strained semiconductors when carriers are injected into them. This property makes it possible to obtain an optical amplification effect and therefore laser emission for a lower energy than the transition energy (of the semiconductor without injected carriers). The wavelength compatibility between the laser and the modulator (typically, 1.55 $\mu$m in the case of the laser and 1.50 $\mu$m in the case of the modulator) is obtained by a slight red shift of the Bragg wavelength. FIG. 4 shows the basic principle of the single structure. The difference in transition energy between the two sections is obtained by narrowing the band gap range carrier injection.

All these known techniques each seem to have intrinsic advantages. However, none of them is truly satisfactory.

With regard to end-to-end coupling, the main advantage is the optimization of the two structures separately. However, the method does involve a good control of the etching and of the epitaxial regrowth on a substrate not prepared for epitaxy, so as to align the layers of the various sections one with respect to another. In addition, the coupling between the two sections is responsible for losses and reflections which may disturb the operation of integrated sources at high-frequency. Moreover, the process requires several epitaxy steps, which incurs a cost.

Localized epitaxy makes it possible to obtain excellent results in terms of component integration. The coupling losses between the various sections are in this case very small and the band gaps of the various sections can be adjusted to precise values according to the mask (for example based on silicon nitride) used. However, its main drawback stems from the fact that the same type of structure is used for each section of the component. Unlike end-to-end coupling, the structures of each section of the component cannot therefore be adjusted separately. For example, for DBR laser-modulator integration, the maximum tunability which can be obtained is limited by the fact that the thickness of the Bragg section is necessarily smaller than that of the active region of the laser. Moreover, a critical surface preparation step is also needed.

With regard to evanescent coupling, the main advantage is the almost independent optimization of two sections of the component (lower structure and upper structure). Moreover, this is a relatively simple technique to employ. On the down side, it is difficult to integrate more than two different sections. This is a handicap in the case, for example, of DBR-modulator integration in which three sections are needed.

The main advantage of the "single structure" is its simplicity. However, as in the case of selective epitaxy, the various sections cannot be optimized separately. This results in a compromise which allows integration only of optical functions exhibiting a relatively small wavelength shift (laser-modulator, modulator-amplifier, etc.). Integration of a laser with a passive guide is impossible as it requires too great a wavelength shift.

Document U.S. Pat. No. 4,054,363 describes a guide formed from a heterostructure of the optical integrated circuit type, provided with a thin film element such as a semiconductor laser coupled through a directional coupler to a guide having a low transmission loss.

The document by Z. M. Chuang et al. "Photonic integrated tunable receivers with optical preamplifiers for direct detection", Applied physics Letters, US, American Institute of Physics, New York, Vol. 63, No. 7, pages 880–882 describes an integrated tunable photonic receiver which comprises, in series, an optical preamplifier, a codirectional coupler forming a filter, and a photodetector.

The object of the present invention is now to provide novel means making it possible to integrate, using a simple technique compatible with industrial processes, a minimum of three sections of different band gap energies with, if possible, structures which are optimized for each section.

Integration by evanescent coupling allows only two optimized sections to be integrated. To integrate three different sections with optimized structures for each is theoretically possible with end-to-end coupling, but three epitaxy stages are needed in this case, with the drawbacks that were mentioned above. Organometallic-selective epitaxy makes it possible to integrate three different sections, but in this case the structures cannot be optimized independently. The same reasoning is valid for the single structure. Admittedly, in this case, very good results have been shown for DFB laser-modulator integration (with 2 sections) (DFB stands for Distributed Feedback, that is to say a laser equipped with a periodic Bragg grating). However, matters become complicated if it is desired to integrate the modulator with a tunable (DBR) laser over a tunability range of 10 nm for example. In this case, a third specific section (Bragg section) must be introduced between the active region of the laser and the modulator.

The aforementioned objective is achieved according to the present invention by means of an optoelectronic system comprising at least three sections corresponding to specific respective functions and having different respective band gap energies, at least for the adjacent pairs of sections, consisting of at least two layers superposed by epitaxy, the upper layer being etched in order to define said sections in the form of two separate end sections limited in the upper layer on each side of an intermediate section defined in the lower layer, and to allow coupling between the intermediate section and each of the end sections which flank it, by evanescent coupling, in which system the length "L" of the intermediate section, in which a Bragg grating is etched, is such that the product K×L (where K is the coupling coefficient of the grating) is of the order of 1.

For example, for K of about 50 cm$^{-1}$, this length L is bout 200 µm.

The present invention also relates to a process for producing the aforementioned system.

The aforementioned concept according to the present invention makes it possible to produce, using a simple and industrializable technology, lasers that can be tuned over more than 10 nm, soliton sources, tandems of modulators, integrated sources for BLU, etc.

BRIEF DESCRIPTION OF THE SEVERAL VIEWS OF THE DRAWINGS

Further features, objectives and advantages of the present invention will become apparent on reading the detailed description which follows and with regard to the appended drawings, given by way of nonlimiting examples and in which.

DETAILED DESCRIPTION OF THE INVENTION

As indicated above, within the context of the present invention, evanescent coupling is combined with the single-active-layer method in order to produce a structure which includes a laser, a passive guide and one or more modulators.

Figure 1:
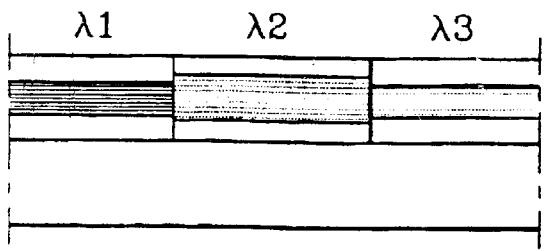
FIGS. 1 to 4, described previously, illustrate four methods according to the prior art.
Figure 2:
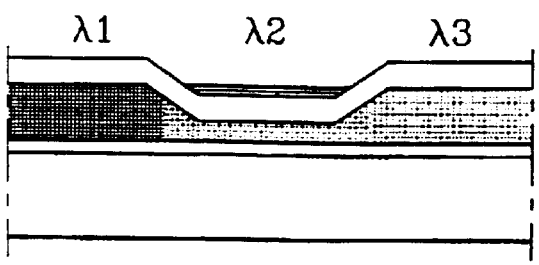
Figure 3:
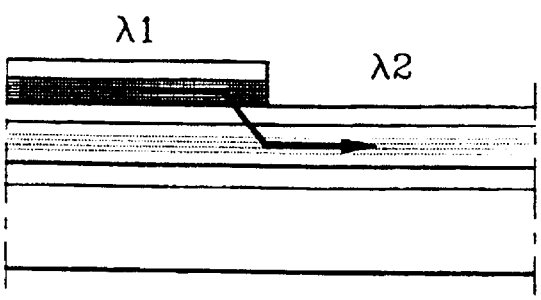
Figure 4:
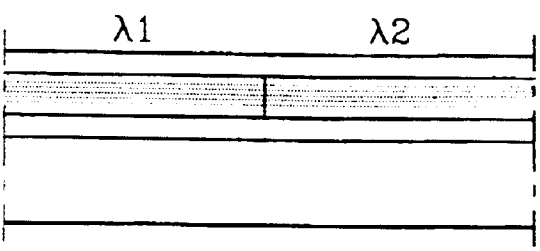
Figure 5A:
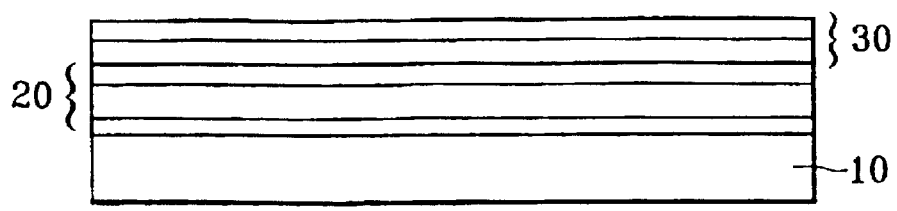
FIG. 5 illustrate schematically a structure according to the present invention at various steps in its fabrication process.
Figure 5B:
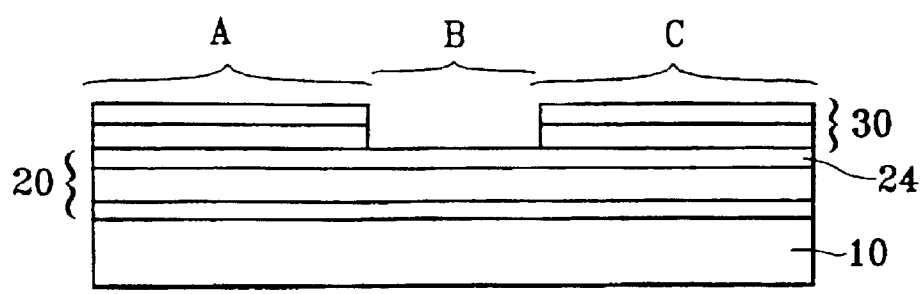
Figure 5C:
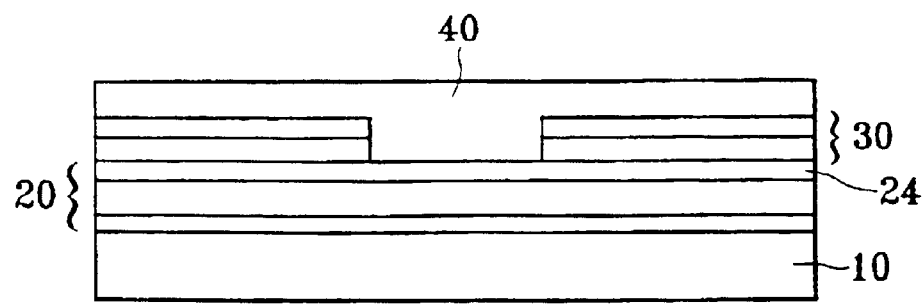
Figure 5D:
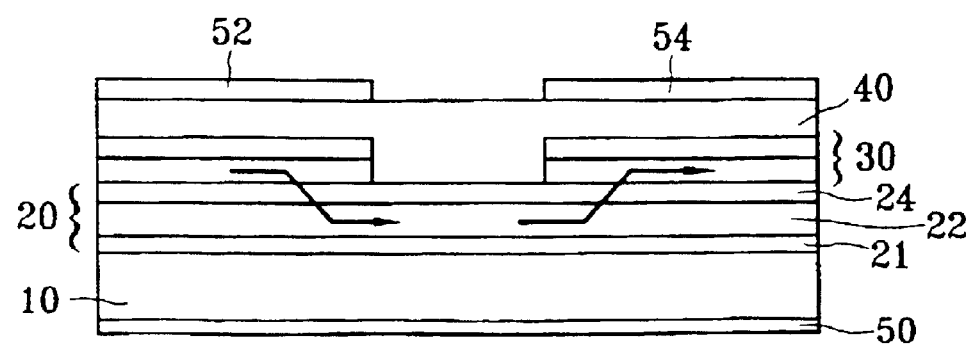

More specifically still, it is preferable, in order to produce a structure according to the present invention as shown schematically in FIG. 5, for the process to be essentially carried out as follows:

i) in a first step, as illustrated in FIG. 5a, two multilayers 20 and 30 are epitaxially deposited in succession on a substrate 10. These two multilayers 20, 30 may, for example, correspond respectively to the optimized structure of a guide section (Bragg section, for example for a DBR laser) and to that, based on multiple strained quantum wells, optimized for laser-modulator integration;

ii) in a second step, as illustrated in FIG. 5b, the upper multilayer 30 thus grown epitaxially is etched down to a stop layer 24 located at the top of the lower multilayer 20, at the positions for the guide section, forming the aforementioned intermediate section, for example the Bragg section in the case of a DBR laser. It will be seen in FIG. 5b that, at the end of this etching step, the two end sections are thus clearly separated. In FIG. 5b, these two end sections, which may serve as DFB laser source and modulator respectively, are labeled A and C, between the intermediate section B exposed in the lower multilayer 20;

iii) where appropriate, a specific treatment may then be carried out on the intermediate section B, for example etching of the Bragg grating in the lower multilayer 20 in the case of a DBR laser;

iv) as illustrated in FIG. 5c, the process then continues with the growth of p$^+$ InP, or of an equivalent material (shown schematically by the label 40) over the entire wafer;

v) and then, as illustrated in FIG. 5d, electrodes are formed on the lower surface of the substrate (label 50) and on the upper layers of the end sections (labels 52 and 54) after having carried out, where appropriate, etching of a stripe in the multilayer stack of the active region.

The metal electrode 50 formed on the lower surface of the substrate 10 is intended to be at ground potential.

The electrodes 52 and 54 are intended to be connected to respective voltage generators suitable for appropriately biasing the two sections A and C, respectively.

The structure consisting of the upper layers 30, having a transition energy of around 1.50 µm, has strained quantum wells. Its gain spectrum, upon current injection, is therefore quite flat around 1.50 µm, including toward the greatest wavelengths (band gap renormalization). A shift toward the low energies is therefore possible as described in documents [5] and [6]. Laser emission at lower energy (for example 1.55 µm) depends on the period of the Bragg grating defined in the intermediate region B.

It will be noted that the equivalent index of the upper multilayer 30 is higher than that of the lower multilayer 20. It is also necessary for the guide section produced in the lower multilayer 20 to be transparent at the wavelength of the laser A.

The optical mode emitted by the section A forming the laser source propagates mainly in the upper multilayer 30 and then passes into the guide structure formed by the lower multilayer 20, within the intermediate section B, when the active structure 30 disappears.

Simulation of this structure by software indicates that coupling coefficients close to 90% upon transition of the optical mode, initially propagating mainly in the upper multilayer 30 within the section A, into the guide structure consisting of the lower multilayer 20 within the section B, are obtained.

After the guide section B/20, the structure 30 is again present and the optical mode passes back predominantly in this structure, within the end section C where the quantum-confined Stark effect may allow its intensity to be modulated.

The simulated coupling coefficient, at this transition from the guide structure 20 into the modulator structure 30, is also close to 90%.

Thus, the process according to the present invention, comprising a single epitaxy step and including a very simple technological process of integrating a modulator with a laser tunable over an extended tunability range (typically greater than 10 nm) depending [sic] only on the confinement coefficient of the optical mode in the guide section B/20 (that is to say the Bragg section in the case of a DBR laser).

Figure 6:
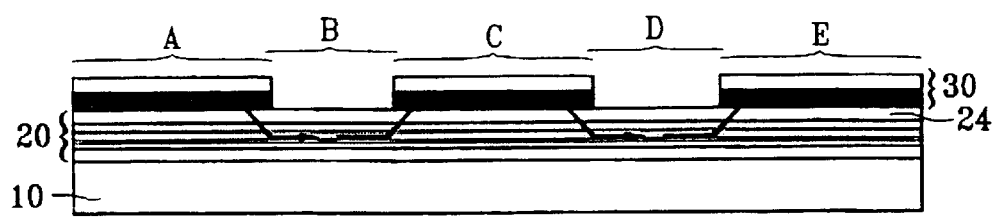
FIG. 6 illustrates schematically a source for RZ transmission according to the present invention.

FIG. 6 illustrates another family of applications relating to DFB laser sources-modulator(s) in which the multilayer 20 is used as passive guide centered around 1.3 $\mu$m in order to prevent optical losses.

Thus, FIG. 6 shows a structure comprising, on a substrate 10, a first multilayer 20 forming a passive guide, on which are superposed three sections A, C and E defined by etching in a second multilayer 30, in order to define a first intermediate section B and a second intermediate section D, respectively, between the aforementioned active sections A, C and E, respectively. The section A serves as a DFB laser, the section C may serve as a first modulator forming a pulse generator and the section E may serve as a second modulator for coding purposes.

In this structure, the mode emitted by the section A forming the source passes by evanescent coupling into the section B of the guide structure 20, passes back up by evanescent coupling to the section C forming the modulator produced in the multilayer 30, passes back down by evanescent coupling into the section D of the guide structure 20 at the end of the section C, and then passes back up, again by evanescent coupling, into the second modulator formed by the section E of the multilayer 30.

Thus, a source for RZ transmissions is obtained.

The same principle may be applied for the production of a BLU-type source for radio-on-fiber applications, involving the integration of a DFB laser and of two modulators coupled using a passive optical circuit.

As indicated previously, in order to allow the aforementioned evanescent coupling between the various sections of the structure which are formed in the two superposed multilayers 20 and 30, it is important within the context of the invention that the length "L" of the intermediate section B or D, in which a Bragg grating is etched (especially in the DBR laser configuration), be such that the product K×L (where K is the coupling coefficient of the grating) is of the order of 1. For example, for K of about 50 cm$^{-1}$, this length L is about 200 $\mu$m.

Thus, within the context of the present invention, intermediate sections B, D with a length L of between 50 and 800 $\mu$m, preferably between 100 and 500 $\mu$m and very advantageously between 150 and 400 $\mu$m, are typically provided.

The process for producing the structure illustrated in FIG. 6 is overall identical to that described previously with regard to FIG. 5.

One particular example of an epitaxially grown structure according to the present invention for the production of a DBR laser will now be described with regard to FIG. 7.

Figure 7:
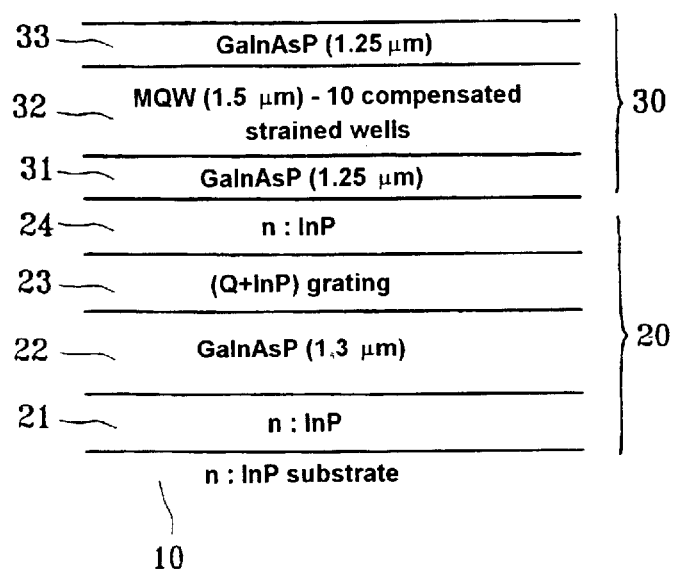
FIG. 7 illustrates an epitaxially grown structure according to the present invention for the production of a DBR laser.

According to the example illustrated in this FIG. 7, the substrate 10 is of the n:InP type and the first multilayer 20 is formed by the successive deposition of an n:InP layer 21, a GaInAsP (1.3 $\mu$m) layer 22 typically having a thickness of about 4000 Å (where appropriate, such a layer may also be formed from multiple quantum wells), an InGaAsP-based layer 23, intended to form a grating, having a typical thickness of about 500 Å, and an n:InP-based stop layer 24 having a typical thickness of about 200 Å, whereas the second multilayer 30 is formed from the superposition of a GaInAsP (1.25 $\mu$m)-based layer 31 having a typical thickness of about 300 Å, a layer 32 comprising multiple (1.50 $\mu$m) quantum wells (for example 10 wells) having a typical thickness of about 1430 Å, and a GaInAsP (1.25 $\mu$m) cover layer 33 having a typical thickness of about 300 Å.

The technological sequences to produce an optoelectric [sic] system based on this stack of epilayers are:

1. etching of the upper structure 30 down to the stop layer 24 (n:InP) at the positions for the sections B and D;
2. etching of the Bragg grating in the Bragg section with the calculated period for laser emission at 1.55 $\mu$m;
3. full-wafer epitaxial regrowth: p:InP (1.8 $\mu$m) +p$^{++}$ :GaInAs (0.3 $\mu$m) (comparable to the layer 40 in FIG. 5);
4. etching of a stripe 2 $\mu$m in width. The "ridge waveguide" structure thus makes it possible to obtain low capacity for high output;
5. implantation-separation of electrodes (comparable to the electrodes 50, 52 and 54 in FIG. 5);
6. metallization.

Simulation of such a structure shows that the coupling coefficient, for coupling between the laser section A and the Bragg section B, is 90% and the confinement of the mode in the Bragg section is 42%. The latter value is compatible with tunability over 10 nm. The same coupling coefficient is then found again when the mode passes from the Bragg section into the modulator C, which is centered at 1.50 $\mu$m while the laser emission is at 1.55 $\mu$m.

The modulation characteristics will therefore be good. Of course, the present invention is not limited to the particular embodiment that has just been described, but extends to all variants in accordance with its spirit.

[1] T. Tanbun-eK, S. Susuki, W. Shu Min, Y Suematsu and S. Sarai, IEEE J. Quant. Electron., Vol 20, 1984, p. 131.

[2] Y. Katoh, K. Yamada, T. Kunii and Yoh Ogawa, IEICE Trans. Electron., Vol. E80-C, 1997, p. 69.

[3] T. L. Koch, U. Koren and B. I. Miller, Appl. Phys. Lett., Vol. 53, 1988, p. 1036.

[4] U. Koren, B. Glance, B. I. Miller, M. G. Young, M. Chien, T. H. Wood, L. M. Ostar, T. L. Koch, R. M. Jopson, J. D. Evankow, G. Raybon, C. A. Burrus, P. D. Magill and K. C. Reichmann, Tech. Dig. Opt. Fib. Communication conference (OFC 92), San Jose, Calif. p.124.

[5] Patent FR-A-2 706 079.

[6] A. Ramdane, F. Devaux, N. Souli, D. Delprat and A. Ougazzaden, IEEE, J. Select. Topics in Quantum Electronics, Vol. 2, 1996, p. 326.

What is claimed is:

1. Optoelectronic system comprising at least three sections (A, B, C) corresponding to specific respective functions and having different respective band gap energies, characterized in that these three sections consist of at least two layers (20, 30) superposed by epitaxy, the upper layer

(30) being etched in order to define said sections in the form of two separate end sections (A, C) defined in the upper layer (30) on each side of an intermediate section (B) defined in the lower layer (20), and to allow coupling between the intermediate section (B) and each of the end sections (A, C) which flank it, by evanescent coupling, in which system the length (L) of the intermediate section (B) is such that the product (K×L), in which (K) represents the coupling coefficient of a grating of the intermediate section (B), is of the order of 1.

2. System as claimed in claim 1, characterized in that the length (L) of the intermediate section (B) is between 50 and 800 µm, preferably between 100 and 500 µm, very advantageously between 150 and 400 µm and very preferably about 200 µm.

3. System as claimed in claim 1, characterized in that the intermediate section (B) comprises a Bragg grating.

4. System as claimed in claim 1, characterized in that the upper layer (30) comprises three sections (A, C and E) placed respectively on each side of two intermediate sections (B and D) provided in the lower multilayer (20).

5. System as claimed in claim 1, characterized in that it constitutes an integrated laser-guide-modulator source.

6. System as claimed in claim 1, characterized in that it constitutes a device chosen from the group comprising optical transmission means with NRZ or RZ type output, distribution means or radio-on-fiber means such as a BLU circuit.

7. System as claimed in claim 1, characterized in that the lower multilayer (20) constitutes a passive guide centered around 1.3 µm.

8. System as claimed in claim 1, characterized in that it comprises two modulators (C and E) in the upper multilayer (30), a first modulator (C) forming a pulse generator and a second modulator (E) serving for coding.

9. System as claimed in claim 1, characterized in that the lower multilayer (20) comprises a GaInAsP-based active layer.

10. System as claimed in claim 1, characterized in that the lower multilayer (20) constitutes an active layer based on multiple quantum wells.

11. System as claimed in claim 1, characterized in that the lower multilayer (20) comprises an active layer (22) flanked by two InP-based layers (21, 23).

12. System as claimed in claim 1, characterized in that the lower multilayer (20) is coated with a stop layer (24), for example based on InP.

13. System as claimed in claim 1, characterized in that the upper multilayer (30) comprises an active layer (32) based on multiple quantum wells.

14. System as claimed in claim 1, characterized in that the upper multilayer (30) comprises an active layer (32) flanked by GaInAsP-based layers (31, 33).

15. Process for producing a system as claimed in claim 1, characterized in that it comprises steps consisting in:

i) depositing two superposed muitilayers (20, 30) on a substrate (10) by epitaxy;

ii) etching the upper multilayer (30) down to a stop layer (24) located at the top of the lower multilayer (20) in order thus to separate at least two end sections (A, C) in the upper multilayer (30) so as to allow evanescent coupling between the intermediate section (B) and each of the end sections (A, C) which flanks it.

16. Process as claimed in claim 15, characterized in that it furthermore includes the step consisting in carrying out a specific treatment on the intermediate section (B).

17. Process as claimed in claim 16, characterized in that the specific treatment consists in etching a Bragg grating in the intermediate section (B).

18. Process as claimed in claim 15, characterized in that it furthermore includes the step consisting in depositing a material, for example based on InP, over the entire wafer of the system.

19. Process as claimed in claim 15, characterized in that it furthermore includes the step consisting in depositing electrodes on the lower surface of the substrate and on the upper surface of the end sections (A, C, E).

* * * * *